United States Patent
Plontke et al.

(10) Patent No.: US 6,774,375 B2
(45) Date of Patent: Aug. 10, 2004

(54) METHOD AND APPARATUS FOR FORMING A CURVED POLYLINE ON A RADIATION-SENSITIVE RESIST

(75) Inventors: Rainer Plontke, Magdala (DE); Andreas Schubert, Niederrossla (DE); Michael Blume, Jena (DE); Ines Stolberg, Jena (DE)

(73) Assignee: Leica Microsystems Lithography GmbH, Jena (DE)

( * ) Notice: Subject to any disclaimer, the term of this patent is extended or adjusted under 35 U.S.C. 154(b) by 373 days.

(21) Appl. No.: 09/797,861

(22) Filed: Mar. 5, 2001

(65) Prior Publication Data

US 2001/0040221 A1 Nov. 15, 2001

(30) Foreign Application Priority Data

Mar. 8, 2000 (DE) .......................................... 100 11 201

(51) Int. Cl.$^7$ ............................................... B23K 15/00
(52) U.S. Cl. ........................... 250/492.21; 250/492.21; 250/492.22
(58) Field of Search ........................ 250/492.1, 492.21, 250/492.22, 310, 492.3, 400, 396 R (56) References Cited

U.S. PATENT DOCUMENTS 3,789,185 A * 1/1974 Baldwin et al. ....... 219/121.28
5,432,898 A * 7/1995 Curb et al. .................. 345/443
6,137,500 A * 10/2000 Silverbrook et al. ........ 345/442
6,405,095 B1 * 6/2002 Jang et al. ................... 700/118

OTHER PUBLICATIONS

Brunger et al.; "Low Energy Lithography; Energy Control and Variable Energy Exposure"; Microelectronic Engineering; Elsevier Science; vol. 27; 1995; pp. 135–138.

* cited by examiner

Primary Examiner—Nikita Wells
Assistant Examiner—Anthony Quash
(74) Attorney, Agent, or Firm—Foley & Lardner LLP (57) ABSTRACT

In a method for forming, with the aid of an electron beam (6), a polyline on a substrate (4) coated with a radiation-sensitive resist, the electron beam (6) is directed onto a surface of the substrate (4) in the direction of a Z coordinate, and the substrate (4) is displaced relative to the electron beam (6) in an X-Y plane in individual steps. After each individual step of the displacement, the electron beam (6) acts with a predefined energy input on the substrate (4) during a halt in the displacement motion. The energy input for each individual step is determined as a function of the shape of the polyline ascertained from several preceding individual steps. Also described is a corresponding apparatus with which, using electron beam lithography, it is possible to form polylines with a very uniform line width. The method and apparatus are particularly suitable for writing curved polylines.

16 Claims, 4 Drawing Sheets

METHOD AND APPARATUS FOR FORMING A CURVED POLYLINE ON A RADIATION-SENSITIVE RESIST

CROSS REFERENCE TO RELATED APPLICATIONS

This invention claims priority of a German patent application DE 100 11 201.3 which is incorporated by reference herein.

FIELD OF THE INVENTION

The invention concerns the field of electron beam lithography, and in particular a method and an apparatus for forming, with the aid of an electron beam, a polyline on a substrate coated with a radiation-sensitive resist, the electron beam being directed onto the coated substrate surface in the direction of the Z coordinate, and the substrate being displaced stepwise in the direction of the X and/or Y coordinate of a Cartesian grid while the electron beam acts with a predefined energy on the resist.

BACKGROUND OF THE INVENTION

Apparatuses for electron beam lithography comprise a radiation source for emitting a collimated electron beam that is directed onto a substrate coated with a radiation-sensitive resist. The substrate, with a surface that bears the resist layer and is oriented perpendicular to the electron beam, is placed onto a stage displaceable in a Cartesian grid and is held thereon. As a result of predefined stage displacement or electromagnetic deflection of the electron beam, or both simultaneously, the impact point of the electron beam being modified with respect to the substrate surface in defined fashion, geometrical structures or patterns, in particular polylines, are written into the resist.

This principle of relative motion between the substrate and the electron beam by displacement of the substrate stage with respect to an at least approximately stationary electron beam is known, for example, from Microelectronic Engineering (1995) 135–138. An alternative possibility for controlled modification of the impact point on the substrate surface consists in deflection of the electron beam, for example by means of electromagnetic deflection systems.

Since apparatuses of this kind for positioning the substrate stage or the electron beam generally use a Cartesian coordinate system with X and Y coordinates, the data description of the geometrical structures to be constituted on the substrate is also preferably embodied in Cartesian coordinates. These are well-suited to the description of structures of predominantly rectangular or trapezoidal shape, such as are typically used in microelectronics. The straight polylines which usually occur in this context can be transferred onto the substrate with little edge roughness using positioning devices controlled in stepwise fashion.

In particular when exposing substrates that are intended for optical applications, however, it is of great interest also to write curved polylines with high accuracy, for example in order to be able to produce elliptical gratings, circular gratings, or even curved waveguides. When a Cartesian grid is used, polylines of this kind can be approximated at best with the accuracy of the individual increments of suitable positioning devices in their X and Y coordinates. If the individual increment distance is selected to be sufficiently small with respect to the width of the desired polyline, it is possible to ignore the edge roughness caused by the stepwise approximation and the geometrical deviation of the approximate polyline from a theoretically ideal polyline.

As a result of stage displacement in incremental steps, a polyline is formed on a substrate by close juxtaposition of a plurality of irradiation points. In order to irradiate a point, the electron beam remains directed onto the point in question for a short dwell time, until a desired energy input has been reached. The beam then moves to the next point, and the same operation is performed. It is not absolutely necessary, in this context, to switch off the electron beam between immediately successive points. The level of energy input onto the location where the electron beam strikes the resist yields a smaller or larger exposed "spot" on the resist.

For the formation of polylines with a very narrow line width that is nevertheless as uniform as possible, it is therefore very important to keep the energy input into the electron-sensitive resist, i.e. the effective dose (charge per unit area) or effective linear dose (charge per unit length) as constant as possible along the polyline. Unlike the edge roughness, the width fluctuations along the polyline that otherwise occur cannot be eliminated by decreasing the individual steps for positioning of the substrate with respect to the electron beam.

A positioning device operated stepwise in the X and Y coordinates makes possible both paraxial individual steps in which progress occurs one individual increment at a time in only one of the X or Y coordinates, or individual steps in which an advance is made in both the X coordinate and the Y coordinate. It is apparent that in the latter case, the spacing between the starting point and end point of the individual step is greater than in the case of a paraxial individual step. If the individual increments in the two coordinates X and Y are identical, there is then a length increase by a factor of $\sqrt{2}$.

Thus if an identical energy input is provided after each individual step, the result is then a higher linear dose for a paraxial polyline in the X or Y coordinate direction than for a diagonal polyline in the direction of a line inclined 45° to the X or Y coordinate. This difference in energy input is expressed as a deviation in line width, so that the diagonal polyline has a narrower width than the paraxial polyline.

If, on the other hand, an energy input elevated by a factor of $\sqrt{2}$ is permanently defined, the result is an excessive linear dose in terms of the line that is to be generated paraxially, since the track length is shorter than in the case of the inclined line. A quantitative calculation shows that in the case presently under consideration, the discrepancy is greatest at an angle of 22.5°, and equals approximately 8%. It would theoretically be possible to decrease this discrepancy by adjusting the energy input for a line as a function of angle, but this would entail a considerably greater calculation effort.

For curved polylines, in particular for circular lines, the path angle continuously changes. Separate calculation of the energy input after each individual step would result in an enormous increase in calculation effort, and therefore drastically decrease the working speed when writing a curved line. This procedure of determining the exact energy input as a function of the instantaneous slope of the polyline after each individual step is therefore unsatisfactory in terms of efficient production. On the other hand, it is precisely in the context of circular gratings that the dose fluctuations resulting from approximation become particularly clearly perceptible, so that it is of interest to remedy this situation.

SUMMARY OF THE INVENTION

It is therefore the object of the present invention to develop the known method for electron beam lithography so as to make possible the formation of curved polylines with a uniform line width and little calculation effort.

According to the present invention, in a method of the kind described initially, the energy to be defined is determined after each individual step as a function of the shape of the polyline ascertained from several preceding individual steps.

The result of this is to achieve an energy input into the resist which is adapted to the greatest possible extent to the shape of the polyline, so that polylines curved in any desired fashion can be produced with a very uniform line width. Because several preceding individual steps are taken into consideration, data concerning the shape of the polyline that have already been acquired or calculated are utilized to determine the energy input after the most recently performed individual positioning step. The calculation effort necessary for this is considerably less than separate calculation of the theoretically exact energy input based on a description of the polyline shape in conjunction with performance of an individual step. This consideration of the past history of each individual step can be implemented essentially with no reduction in working speed.

The fundamental principle of the method according to the present invention consists in defining a number of categories of individual steps, each of which has assigned to it a specific correction factor for the purpose of determining the energy input in the context of an individual step that will follow later. It is advisable in this context to weight the correction factors assigned to the categories of different individual steps in accordance with the respective shortest path length between the starting point and end point, and to assign individual steps having the same weighting to one respective category.

In a preferred embodiment of the method, only two categories of individual steps are used, namely a first category A of paraxial individual steps in the form of individual increments in the direction of the X coordinate or the Y coordinate, and a second category B of diagonal individual steps in the form of an individual increment in both the X and the Y coordinate.

The individual steps of category A are assigned a correction factor of 1, and those of category B a correction factor of $\sqrt{2}$. Determination of the energy input for a subsequent individual step is accomplished, according to the present invention, as a function of a number of previously completed individual steps in category A and in category B. Because of the orientation toward the individual increments in the X and Y coordinates and the small number of different types of individual steps, the control and calculation outlay associated with application of the method remains low. A highly uniform profile is nevertheless achieved for the effective linear dose (and thus for the line width) along a trajectory of any desired curvature, regardless of its path angle.

A particularly low calculation effort is achieved, for example, if eight immediately preceding individual steps are considered, and if an average correction factor $K_n$ is determined in accordance with an allocation protocol as a function of the number of individual steps in categories A and B, as discussed below.

It is nevertheless certainly possible to reduce the number of individual steps that are considered retrospectively as necessary or, in order to improve accuracy further, to increase it. The hardware and calculation outlay rises, however, with an increasing number of individual steps to be considered. Individual steps that are far in the past may furthermore result in an incorrect determination of the average correction factor $K_n$. Taking this problem into account, a consideration of eight preceding individual steps has proven particularly advantageous. The energy input is preferably made in proportion to the calculated average correction factor $K_n$.

In the context of a consistent radiation output, the energy input is adjusted, by way of the application duration of the electron beam for each individual step, in proportion to the correction factor $K_n$. This procedure has the advantage that a field emission cathode, which is notable for its extraordinarily uniform radiation output in steady-state operation, can be used as the radiation source. The application duration is defined by the halt time of the stage positioning device after an individual step. The time interval during which the stage remains in position after an individual step has been performed is consequently proportional to the average correction factor $K_n$.

In an alternative embodiment of the method, the energy input is made by modifying the radiation output in the context of a consistent application duration or constant halt time. This has the advantage that stage displacement can be effected with no change in the working cycle. If a field emission cathode is used as the radiation source, however, it is not advisable to modify its radiation output during operation, since the radiation output adapts only very slowly to any change in an applied voltage. Instead, in order to influence the energy input, the electron beam emitted from the radiation source is attenuated downstream, for example using an air coil. The first-mentioned variant with a variable halt time is preferable in this regard.

The object of the invention is furthermore achieved with an apparatus for forming a polyline on a substrate coated with a radiation-sensitive resist with the aid of an electron beam, comprising a radiation source for irradiating the substrate with an electron beam in the direction of a Z coordinate; a positioning device, movable in individual steps in an X-Y plane in order to effect a relative motion between the substrate and the electron beam; and a calculation circuit for ascertaining the energy to be defined for a respective individual step as a function of the shape of the polyline ascertained from several preceding individual steps, the calculation circuit being connected to the activation circuit for the radiation source.

The apparatus according to the present invention makes possible application of the method explained above for generating a polyline of any desired curvature, with an energy input into the resist adapted to the greatest possible extent to the shape of the polyline and thus with a consistent line width.

BRIEF DESCRIPTION OF THE DRAWINGS

The invention will be explained in more detail below with reference to an exemplary embodiment depicted in the appended drawings, in which.

DETAILED DESCRIPTION OF THE INVENTION

Figure 1:
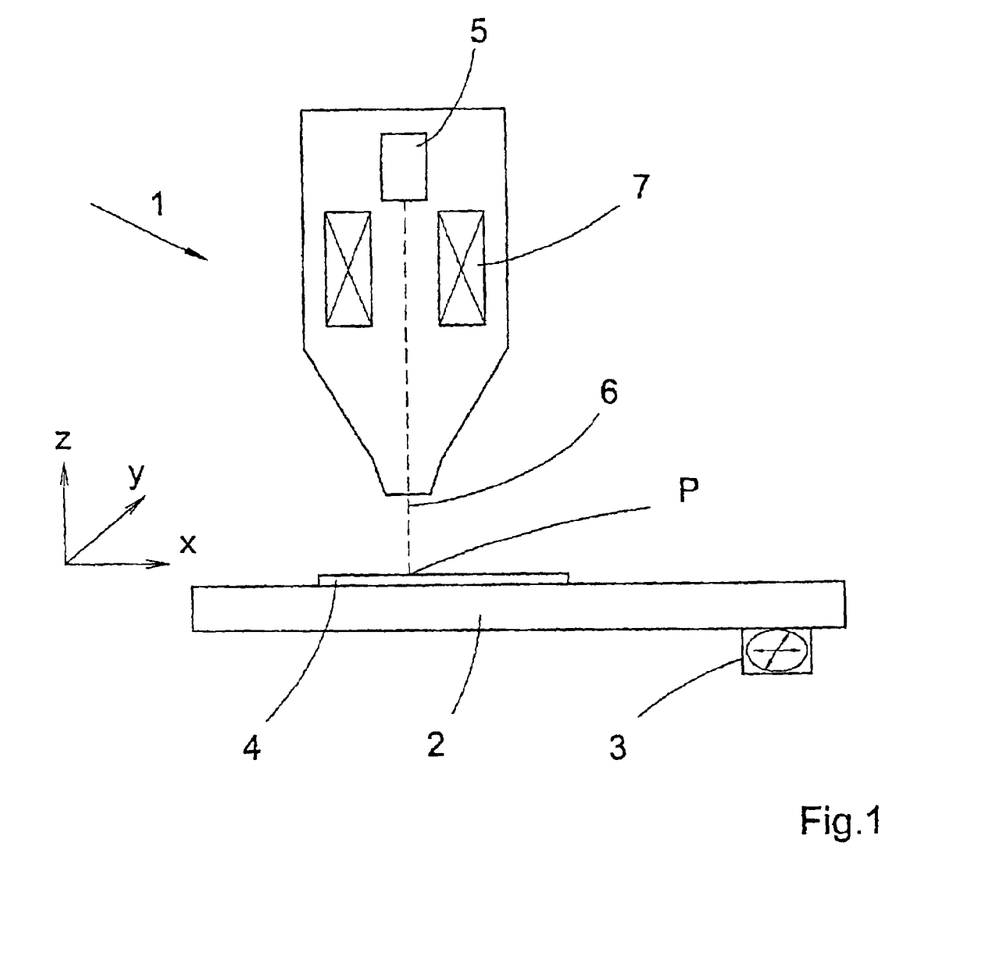
FIG. 1 schematically depicts an exemplary embodiment of an apparatus for electron beam lithography.

The exemplary embodiment shows, in FIG. 1, an apparatus 1 for electron beam lithography. This comprises a stage 2, displaceable in the X and Y coordinates, for holding a flat substrate 4 that extends in the X-Y plane. Substrate 4 is made of a radiation-sensitive material or at least has a coating made of such a material.

Stage 2 has a feed device 3 associated with it. By means of feed device 3, the stage can be moved stepwise in both the X coordinate and the Y coordinate. The smallest individual feed units in the directions of the two coordinates X and Y, i.e. the individual increments of feed device 3, are on the order of 1 nm to 10 nm for each coordinate X and Y, the feed velocity being approximately 1 mm per second. For example, an individual increment distance of 2.5 nm is used for both coordinates.

The apparatus for electron beam lithography further comprises an electron beam source 5 that directs a collimated electron beam 6 with a constant radiation density onto stage 2 and substrate 4. Electron beam 6 acts on substrate 4 in the direction of coordinate Z, perpendicular to the X-Y plane. A thermal field emission cathode, which is notable for a highly constant radiation density in electron beam 6, is preferably used here as electron beam source 5.

Placed after electron beam source 5 is an electromagnetic deflection device 7 with which the impact point of electron beam 6 on the surface of substrate 4 can be positioned. Deflection device 7 allows a deflection of electron beam 6 both in the direction of the X coordinate and in the direction of the Y coordinate; activation can be accomplished in both analog and digital fashion, for example with 16-bit resolution. In FIG. 1, electron beam 6 is depicted in its undeflected orientation, perpendicular to the surface of substrate 4 and stage 2.

In order to write a polyline onto the surface of substrate 4, stage 2 is moved in accordance with a predefined trajectory beneath electron beam 6, which to a first approximation is stationary. Any deviations in the real position of stage 2 from a predefined position are measured, for example with a laser interferometer, and dynamically compensated for by a corresponding deflection of electron beam 6. The deflection of electron beam 6 is here on the order of a maximum of approximately 20 $\mu$m.

Also provided is a control and calculation circuit with which a polyline to be formed on substrate 4 is first defined and then converted into feed instructions for feed device 3 and definitions for the energy input into substrate 4. The desired polyline can be defined by way of a plurality of small individual steps or curve interpolation points in Cartesian coordinates. A high-resolution polyline (in the nanometer range) results, however, in a very large data volume with a large processing outlay. For curved polylines, the speed with which the polyline is written onto substrate 4 is then relatively low.

In the present case, therefore, the polyline is preferably approximated by way of Bézier curve segments. From the few parameters of the Bézier curve segments, the reference position to be established on stage 2 can then be calculated, step for step, in accordance with the step distance of feed device 3. This makes possible a considerable reduction in data volume, especially for curved polylines, and an increase in working speed when writing the polyline. A suitable algorithm for calculating the individual steps from the Bézier curve segments is disclosed in DE 42 44 462 A1, and hence need not be explained in more detail here.

For a particularly high resolution and close approximation in the context of a polyline defined in Bézier parameters, it is preferable to use the smallest possible individual steps of feed device 3. As already explained above, the latter is movable stepwise in the X coordinate and in the Y coordinate. The smallest possible individual steps that initially result are thus stage displacements in which one individual increment is performed in one coordinate direction. With two coordinates X and Y, four different possibilities therefore exist.

Figure 2:
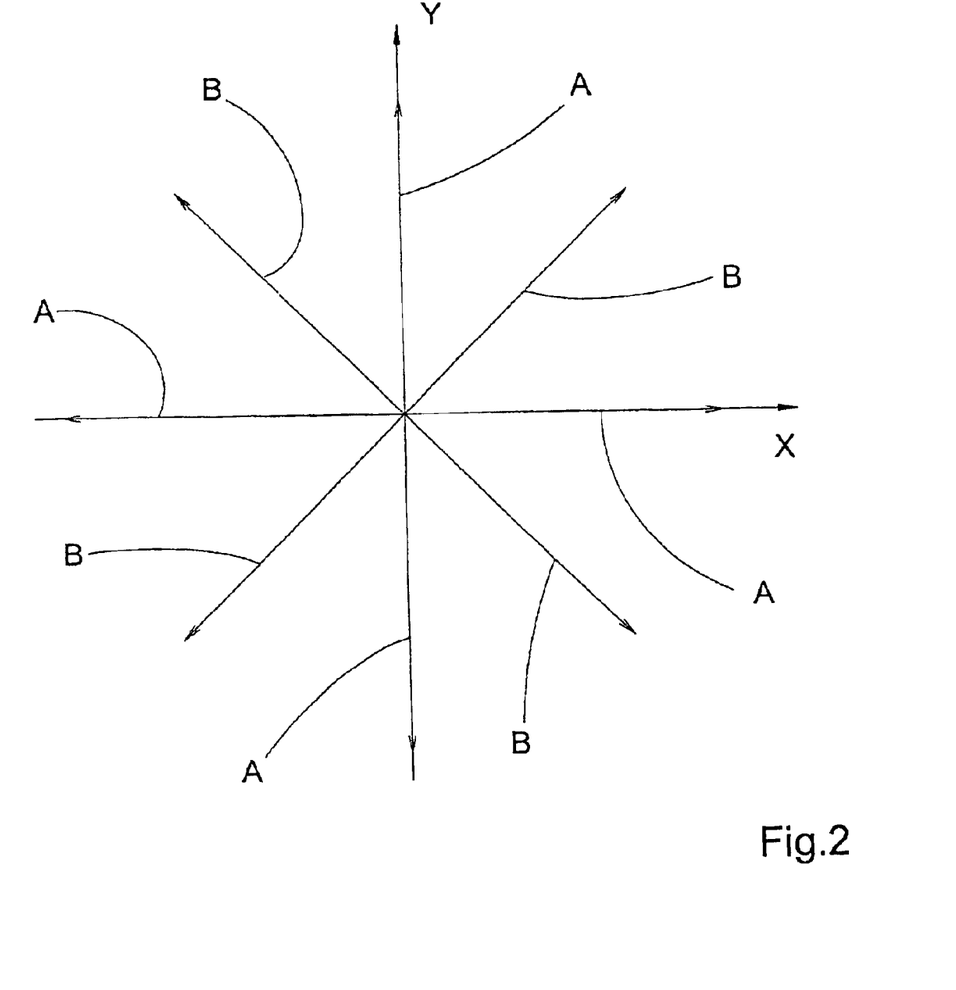
FIG. 2 shows a diagram to illustrate the possible individual steps for displacing a substrate by means of a stage of the apparatus of FIG. 1.

It is furthermore possible to perform a displacement by one individual increment in the two coordinates X and Y simultaneously, thus resulting in four further (diagonal) individual steps. The total of eight possible directions of the individual steps possible with this procedure are depicted in FIG. 2. On the assumption that the individual increments in the X and Y coordinates are of identical size, the diagonal individual steps have a path length longer by a factor of $\sqrt{2}$ than the paraxial individual steps.

The directions of the individual steps depicted in FIG. 2 constitute the basic elements used here for approximation of a polyline. They can be divided into two categories in accordance with the path length of the individual steps; here the shorter (i.e. paraxial) individual steps are assigned to a category A, and the diagonal individual steps to a category B.

In principle, however, it is also possible to define additional types of individual steps, for example by defining such a step by way of several individual increments in one or both coordinate directions. Categorization of the steps is then once again performed in accordance with their theoretical path length. Individual increments with different lengths in the two (X and Y) coordinates can also be used.

When a polyline is written onto substrate 4, a calculation is continuously made online, from the Bézier parameters, of individual steps to be performed by stage 2; these are implemented by positioning device 3 and thus result in a quasi-continuous stage motion. As soon as an individual step has been calculated, a determination is made as to whether it is a member of category A or of category B. Depending on its membership, a correction factor is assigned to the relevant individual step, the correction factors being in each case proportional to the shortest path length of the individual steps. In the exemplary embodiment described here, a scaling is performed to the individual steps of category A, to which a correction factor of 1 is assigned, whereas the correction factor $\sqrt{2}$ is assigned to the diagonal individual steps.

Once ascertained, the correction values are stored in a buffer memory in the form of a shifter that can temporarily store a predefined number of correction values. As a new correction value is stored, the respectively oldest stored value is removed from the buffer memory. In this fashion, for example, the last eight correction values are kept available.

By means of these correction factors, the instantaneous path angle of the polyline can be approximately taken into account. In the present case, this is done by taking the average of the correction factors stored in the buffer memory; this, as the average correction factor $K_n$, yields more accurate information concerning the slope of the trajectory. The average correction factor $K_n$ is determined by ascertaining how many of the last eight individual steps fall into category A and how many into category B. An average correction factor $K_n$ is assigned to each of the nine possible combinations in this context, resulting in the following relationship:

| No. of individual steps in category A | No. of individual steps in category B | Average correction factor $K_n$ |
|---|---|---|
| 8 | 0 | 1.000 |
| 7 | 1 | 1.008 |
| 6 | 2 | 1.031 |
| 5 | 3 | 1.068 |
| 4 | 4 | 1.118 |
| 3 | 5 | 1.179 |
| 2 | 6 | 1.250 |
| 1 | 7 | 1.329 |
| 0 | 8 | $\sqrt{2}$ |

The average correction factor $K_n$ calculated for an individual step is used to determine the energy input into substrate 4 after the relevant individual step, so that the energy input into substrate 4 is made in proportion to correction factor $K_n$ and thus in accordance with the instantaneous path angle of the polyline.

When a thermal field emission cathode is used as electron beam source 5, for reasons already discussed it is inadvisable to modify the radiation output of the cathode. The energy input, i.e. the energy dose introduced into substrate 4 at impact point P of electron beam 6, can, however, be influenced by way of the application duration of electron beam 6 onto impact point P. For that purpose, in simple fashion, the dwell time of stage 2 after an individual step is set in proportion to the correction factor $K_n$.

Figure 3:
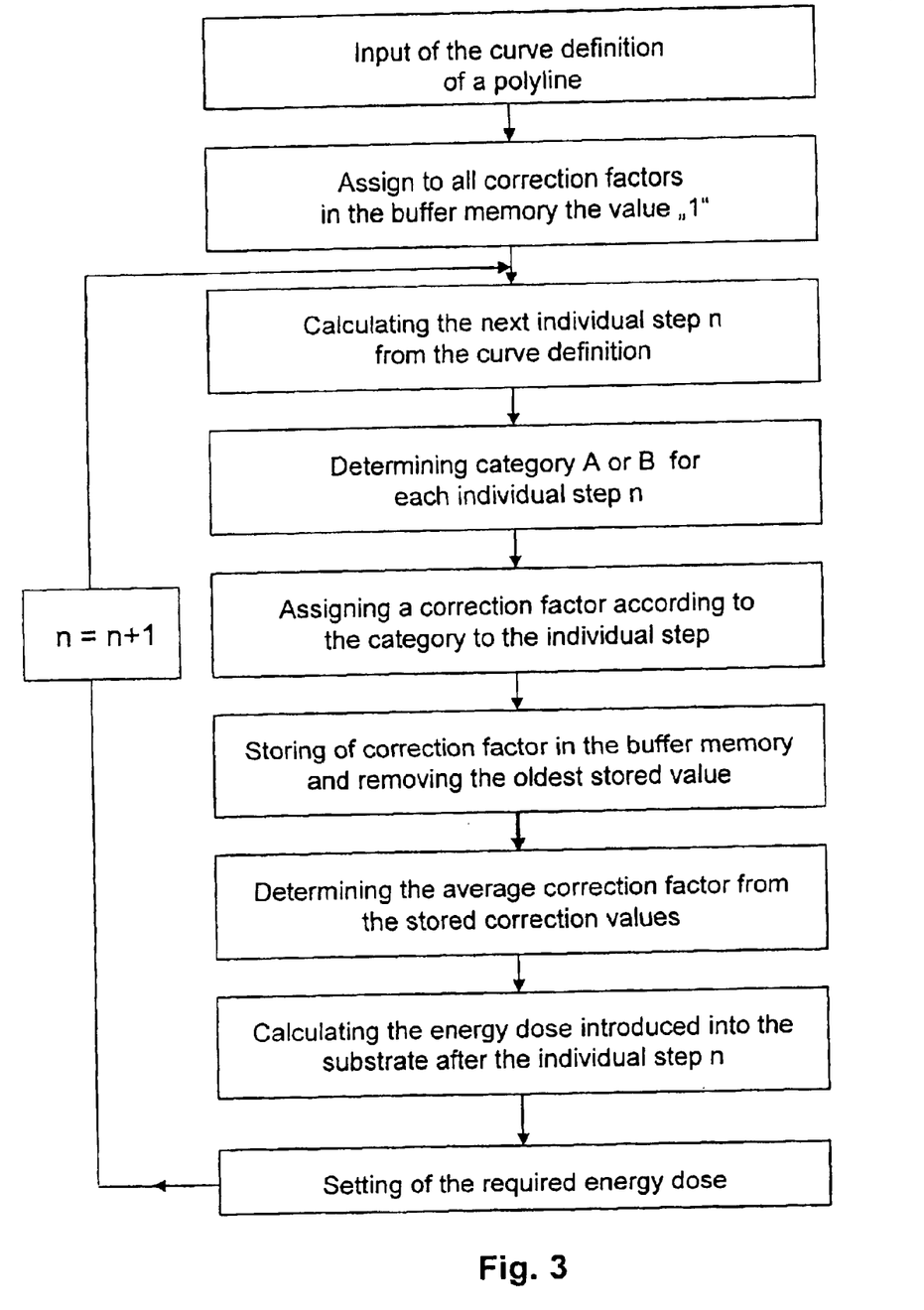
FIG. 3 shows a flow chart, stored in a control and calculation circuit of the apparatus of FIG. 1, for determination of the energy input into the substrate.

Calculation of the next individual step can already be being performed concurrently with this, in the manner already described. A corresponding flow chart is depicted in FIG. 3.

In a variant embodiment of the invention, the energy input is adjusted by way of a change, after an individual step, in the radiation output acting on impact point P. For this purpose, it would in principle be conceivable to implement the change in the radiation output emitted by radiation source 5 directly on the latter. This is not advisable when a thermal field emission cathode is being used, however, since it reacts very slowly to any change in its adjustment parameters.

In such a case, the constant electron beam 6 emitted by the field emission cathode is instead diminished by a downstream attenuation device, for example an air coil.

This is adjusted, as a function of the average correction factor $K_n$, in such a way that the radiation output of electron beam 6 after it has been attenuated is proportional to the average correction factor $K_n$ that was ascertained for the individual step in question.

Because of the fact that, in both cases, the "past history" of an individual step is taken into account in determining the radiation energy to be introduced into substrate 4 after that individual step, the over-irradiation effects discussed above are reduced to a slight residual error on the order of approximately 0.5%, which in practice can be ignored.

At the beginning of a curve, however, there is no earlier information available about preceding individual steps. This is remedied by the fact that a correction value is arbitrarily set in the buffer memory for the nonexistent individual steps. The initial error resulting therefrom has, however, practically no effect. If, for example, eight preceding individual steps are considered, then complete consideration of the previous shape of the polyline is accomplished as of the ninth individual step. The unknown individual steps are assigned on a temporary basis to category A, and receive a correction factor of 1.

Figure 4:
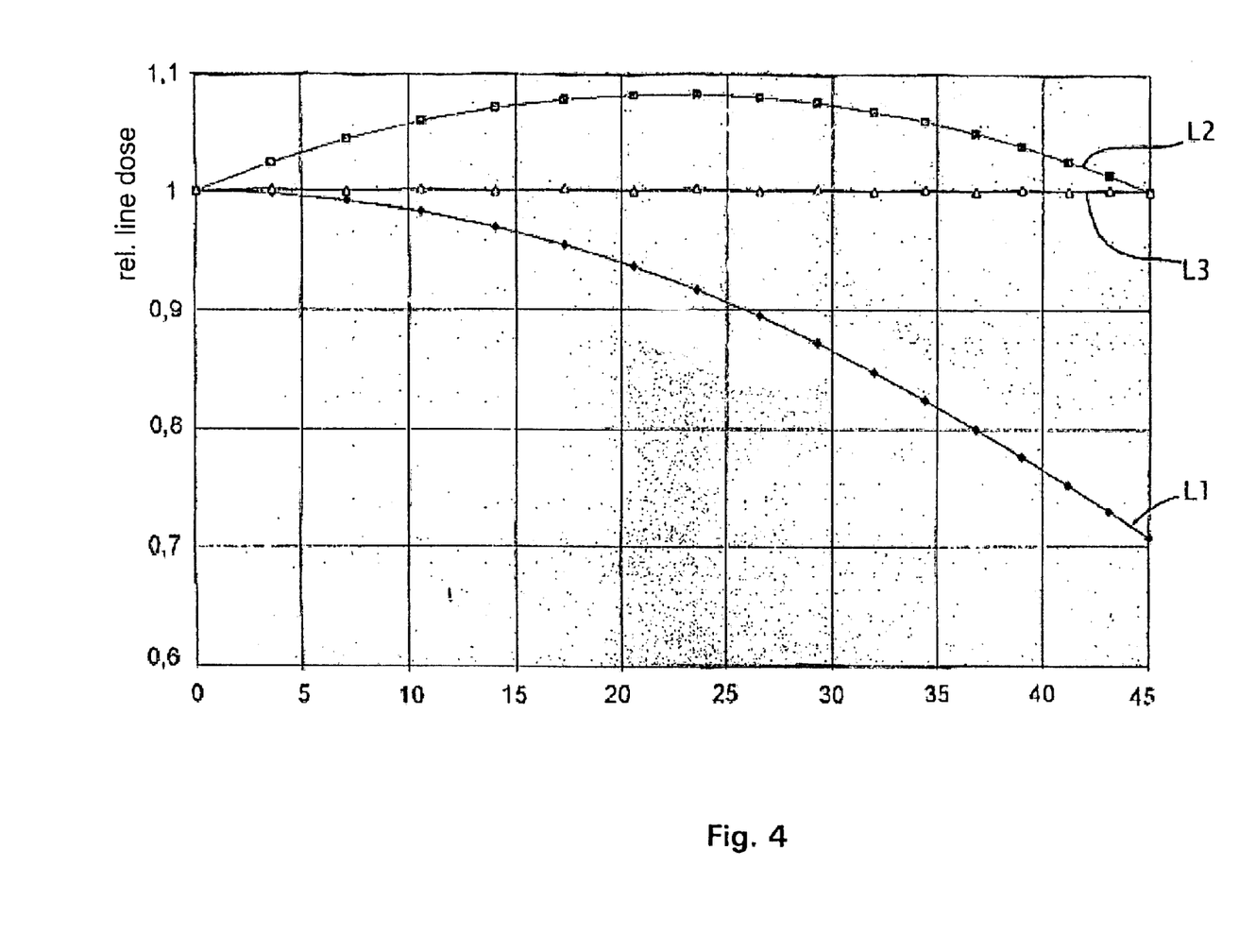
FIG. 4 shows a diagram to illustrate the relative linear dose when writing circular rings in an X-Y plane, as a function of the angle with respect to one of the coordinates X or Y.

FIG. 4 shows a comparison of the relative linear dose when writing circular lines, as a function of the angle with respect to a coordinate axis. An angle of 0° corresponds to a paraxial track segment, whereas an angle of 45° represents a track segment parallel to the first angle bisector.

If a circular ring is approximated by individual steps of the aforementioned categories A and B, and if an energy input of identical magnitude is made after each individual step, then a polyline will be written at the correct linear dose only for paraxial segments. The dose is then too low, however, for all the other, curved track segments, as is graphically evident from L1.

If, on the other hand, the energy input after diagonal steps of category B is increased, in contrast to the paraxial individual steps of category A, by a factor of $\sqrt{2}$, then the correct linear dose is achieved for paraxial segments of the polyline and also for segments at an angle of 45°. The energy input is too high for path angles in between, however, so that at those points there is an undesired change in the width of the polyline that depends on path angle. This is illustrated in FIG. 2 with reference to line L2.

The result of taking preceding individual steps into consideration in determining the energy input into the substrate, assuming eight preceding individual steps are considered, is curve L3, which exhibits a very slight (and in practice negligible) correlation between linear dose and the path angle of the polyline.

Parts list

1 Apparatus
2 Stage
3 Feed device
4 Substrate
5 Radiation source
6 Electron beam
7 Deflection direction
X, Y, Z Coordinates
$K_n$ Average correction factor

What is claimed is:

1. A method for forming, with the aid of an electron beam (6), a polyline on a substrate (4) coated with a radiation-sensitive resist, comprising:

directing the electron beam (6) onto the coated substrate surface in the direction of the Z coordinate of a Cartesian grid;

displacing the substrate (4) stepwise in the direction of the X and/or Y coordinate of the Cartesian grid, while the electron beam (6) acts with a predefined energy on the resist, wherein an individual step is defined by a movement in the direction of the X and/or the Y coordinate of the Cartesian grid; and determining the energy to be direction after of each individual step as a function of the shape of the polyline ascertained from several preceding individual steps.

2. The method as defined in claim 1, wherein the individual steps are sorted into categories as a function of the displacement of the substrate (4), as follows:

category A: paraxial individual steps with the step distance of one individual increment in the direction of the X coordinate or in the direction of the Y coordinate; and category B: diagonal individual steps with the step distance of one individual increment each in the direction of the X coordinate and in the direction of the Y coordinate, category A being assigned a correction factor of 1 and category B a correction factor of √2, and the energy to be defined in each case being determined as a function of the number of previously completed individual steps of category A and of category B within a defined number of preceding individual steps.

3. The method as defined in claim 1, wherein the radiation-sensitive resist reacts to the electron beam (6) so that a polyline is written on a substrate (4) corresponding to the displacement of the substrate (4).

4. A method for forming, with the aid of an electron beam (6), a polyline on a substrate (4) coated with a radiation-sensitive resist, comprising:
   directing the electron beam (6) onto the coated substrate surface in the direction of the Z coordinate of a Cartesian grid;
   displacing the substrate (4) stepwise in the direction of the X and/or Y coordinate of the Cartesian grid while the electron beam (6) acts with a predefined energy on the resist, wherein an individual step is defined by a movement in the direction of the X and/or the Y coordinate of the Cartesian grid; and
   determining the energy of each individual step as a function of the shape of the polyline ascertained from several preceding individual steps; wherein
      the individual steps are sorted into categories as a function of the displacement of the substrate (4), as follows:
         category A: paraxial individual steps with the step distance of one individual increment in the direction of the X coordinate or in the direction of the Y coordinate; and
         category B: diagonal individual steps with the step distance of one individual increment each in the direction of the X coordinate and in the direction of the Y coordinate,
            category A being assigned a correction factor of 1 and category B a correction factor of √2, and the energy to be defined in each case being determined as a function of the number of previously completed individual steps of category A and of category B within a defined number of preceding individual steps, wherein the energy to be defined is determined as follows on the basis of an average correction factor $K_n$ from eight preceding individual steps, n being a numerical index:

| No. of individual steps in category A | No. of individual steps in category B | Average correction factor $K_n$ |
|---|---|---|
| 8 | 0 | 1.000 |
| 7 | 1 | 1.008 |
| 6 | 2 | 1.031 |
| 5 | 3 | 1.068 |
| 4 | 4 | 1.118 |
| 3 | 5 | 1.179 |
| 2 | 6 | 1.250 |
| 1 | 7 | 1.329 |
| 0 | 8 | √2. |

5. The method as defined in claim 4, wherein energy is modified or redefined from individual step to individual step in proportion to the average correction factor $K_n$.

6. The method as defined in claim 5, wherein with a constant radiation output, the application duration of the electron beam (6) is modified or redefined for each individual step in proportion to the correction factor $K_n$.

7. The method as defined in claim 3, wherein with a constant application duration for the electron beam (6), the beam output is modified or redefined for each individual step in proportion to the correction factor $K_n$.

8. An apparatus for forming a polyline on a substrate (4) coated with a radiation-sensitive resist, comprising
   a radiation source (5) for an electron beam (6) oriented in the Z coordinate of a Cartesian grid;
   a feed device (3) displaceable in individual steps in an X-Y plane of the Cartesian grid in order to generate a relative motion between the substrate (4) and the electron beam (6), wherein an individual step is defined by a movement in the direction of the X and/or the Y coordinate of the Cartesian grid; and
   a calculation circuit adapted to ascertain energy to be defined for a respective individual step as a function of the shape of the polyline ascertained from several preceding individual steps, the calculation circuit being connected to an activation circuit for the radiation source (5).

9. A method for forming, with the aid of an electron beam (6), a polyline on a substrate (4) coated with a radiation-sensitive resist, characterized by the following steps:
   directing the electron beam (6) onto the coated substrate surface in the direction of the Z coordinate of a Cartesian grid;
   displacing the substrate (4) stepwise in individual steps in the direction of the X and/or Y coordinate of the Cartesian grid while the electron beam (6) imparts a predefined energy dose on the resist; and
   determining a dwell time between individual steps as a function of the shape of the polyline ascertained from several preceding individual steps so that the energy dose to be defined at each individual step is substantially constant.

10. The method as defined in claim 9, wherein the radiation-sensitive resist reacts to the electron beam (6) so that a polyline is written on a substrate (4) corresponding to the displacement of the substrate (4).

11. The method as defined in claim 9, wherein the individual steps are sorted into categories as a function of the displacement of the substrate (4), as follows:
   category A: paraxial individual steps with the step distance of one individual increment in the direction of the X coordinate or in the direction of the Y coordinate; and
   category B: diagonal individual steps with the step distance of one individual increment each in the direction of the X coordinate and in the direction of the Y coordinate, wherein
      steps falling into category A are assigned a correction factor of 1 and steps falling into category B are assigned a correction factor of √2, and the energy dose to be defined at each individual step is determined as a function of the number of previously completed individual steps of category A and of category B within a defined number of preceding individual steps.

12. The method as defined in claim 11, wherein the energy dose to be defined is determined on the basis of an average correction factor $K_n$, from eight preceding individual steps, n being a numerical index, according to the following chart:

| No. of individual steps in category A | No. of individual steps in category B | Average correction factor $K_n$ |
|---|---|---|
| 8 | 0 | 1.000 |
| 7 | 1 | 1.008 |
| 6 | 2 | 1.031 |
| 5 | 3 | 1.068 |
| 4 | 4 | 1.118 |
| 3 | 5 | 1.179 |
| 2 | 6 | 1.250 |
| 1 | 7 | 1.329 |
| 0 | 8 | $\sqrt{2}$. |

13. The method as defined in claim 12, wherein the energy dose is modified or redefined from individual step to individual step in proportion to the average correction factor $K_n$.

14. The method as defined in claim 13, wherein the application duration of the electron beam (6) is modified or redefined with a constant radiation output for each individual step in proportion to the correction factor $K_n$.

15. The method as defined in claim 13, wherein the beam output is modified or redefined with a constant application duration for the electron beam (6) for each individual step in proportion to the correction factor $K_n$.

16. An apparatus for forming a polyline on a substrate (4) coated with a radiation-sensitive resist, comprising
   a radiation source (5) for an electron beam (6) oriented in the Z coordinate of a Cartesian grid;
   a feed device (3) displaceable in individual steps in an X-Y plane of the Cartesian grid in order to generate a relative motion between the substrate (4) and the electron beam (6), wherein an individual step is defined by a movement in the direction of the X and/or the Y coordinate of the Cartesian grid; and
   a calculation circuit adapted to ascertain a dwell time between individual steps as a function of the shape of the polyline ascertained from several preceding individual steps, the calculation circuit being connected to an activation circuit for the radiation source (5) so that an energy dose to be defined at each individual step is substantially constant.

* * * * *